United States Patent
Van De Kerhof et al.

(10) Patent No.: US 6,906,787 B2
(45) Date of Patent: Jun. 14, 2005

(54) LITHOGRAPHIC APPARATUS, DEVICE MANUFACTURING METHOD, AND DEVICE MANUFACTURED THEREBY

(75) Inventors: Marcus Adrianus Van De Kerhof, Helmond (NL); Wilhelmus Petrus De Boeij, Veldhoven (NL); Marcel Maurice Hemerik, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 66 days.

(21) Appl. No.: 10/716,938

(22) Filed: Nov. 20, 2003

(65) Prior Publication Data

US 2004/0114120 A1 Jun. 17, 2004

(30) Foreign Application Priority Data

Dec. 4, 2002  (EP) ............................................. 02080107

(51) Int. Cl.[7] .......................... G03B 27/54; G03B 27/72
(52) U.S. Cl. ............................................. 355/67; 355/71
(58) Field of Search .............................. 355/53, 67–71; 250/372; 372/23

(56) References Cited

U.S. PATENT DOCUMENTS 6,256,087 B1 * 7/2001 Bader ........................... 355/67
6,327,284 B1 * 12/2001 Stamm et al. ................. 372/32
6,636,297 B2 * 10/2003 Wakabayashi et al. ........ 356/51
6,713,795 B2 * 3/2004 Kuhlmann ................... 257/290
2002/0096728 A1  7/2002 Kuhlmann ................... 257/432
2002/0101574 A1  8/2002 Tsuji ............................ 355/69

FOREIGN PATENT DOCUMENTS

EP  1 182 511  2/2002
EP  1 331 519  7/2003

* cited by examiner

*Primary Examiner*—Henry Hung Nguyen
(74) *Attorney, Agent, or Firm*—Pillsbury Winthrop LLP

(57) ABSTRACT

A lithographic projection apparatus includes a radiation system for providing a projection beam of primary radiation, a support structure for supporting patterning structure, the patterning structure serving to pattern the projection beam according to a desired pattern, a substrate table for holding a substrate, a projection system for projecting the patterned beam onto a target portion of the substrate, a radiation sensor which is moveable in a path traversed by the projection beam, for receiving primary radiation out of the projection beam, the sensor including a radiation-sensitive material which converts incident primary radiation into secondary radiation, a radiation detector capable of detecting said secondary radiation emerging from said material, and a filter material for preventing secondary radiation from traveling in a direction away from the radiation detector.

24 Claims, 4 Drawing Sheets

LITHOGRAPHIC APPARATUS, DEVICE MANUFACTURING METHOD, AND DEVICE MANUFACTURED THEREBY

This application claims priority from European Patent Application 02080107.2, filed Dec. 4, 2002 which is herein incorporated by reference in its entirety.

BACKGROUND OF THE INVENTION

1. Field of the Invention

The present invention relates generally to a lithographic projection apparatus and more particularly to a lithographic projection apparatus having a moveable radiation sensor in a path of the projection beam.

2. Description of the Related Art

The term "patterning device" or "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structures include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning means can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning means as here above set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Semiconductor-based photo-detectors or photo-detector arrays are generally sensitive in the visible and the infrared red part of the spectrum. To make photo-diodes more sensitive to electromagnetic radiation in the ultraviolet region (UV), comprising the Deep Ultraviolet region (DUV, typically ranging from 250–190 nm) and the Vacuum Ultraviolet region (VUV, typically ranging from 195–120 nm) they can be coated with a conversion layer that absorbs the DUV/VUV radiation and converts it into radiation with a longer wavelength referred to hereinafter as "secondary radiation". This secondary radiation is usually of a wavelength in the infrared and visible light and ultraviolet spectrum, that is, generally of a wavelength of 400 nm to 1 micron. The radiation which is to be converted will be referred to hereinafter as "primary radiation".

These conversion coatings are typically 1–50 micron thick and can therefore be applied without the loss of resolution of the underlying array of photodiodes (typical pixel size 5–50 micron). A typical conversion coating may be selected from $Gd_2O_2S:Tb$ also named P43, $Y_2SiO_5:Ce$, Tb (P47), and $Zn_2SiO_4:Mn$ (P1). Also CaS:Ce, YAG:Ce and ZnS:Ag, Al, are used as conversion coating material. These coatings leave the incoming visible or infrared radiation almost completely unaffected and do not generally decrease the camera's sensitivity to radiation of visible and infrared wavelengths. The secondary radiation is emitted more or less isotropically, so that about 50% of the secondary radiation is emitted backwards and does not reach the photosensitive surface. This results in a significant yield loss for the photo detector, since only half of the incident radiation energy is detected. Further, the secondary radiation emitted in the direction away from the photosensitive surface might reflect at some distance above the image sensor, return to the image sensor, and fall upon the wrong pixel (not the pixel where the DUV light was absorbed).

Especially if this photo-detector array is used as the detection part of a sensor module which consists of said photo-detector array in conjunction with an optical element with a spatially varying transmission or phase distribution, for e.g. alignment or dose measurements, in front of the array, this additional optical element will easily give rise to such spurious reflections.

This effect results in the loss of spatial resolution and in the generation of 'unwanted' ghost images on the image sensor. In addition, because of the relative high sensitivity for visible and infrared radiation, stray light in these wavelength ranges gives a large unwanted background. In a scanner, other measurement systems based on optical methods that employ radiation at these wavelengths will give rise to an unwanted cross-talk between different diagnostic systems.

SUMMARY OF THE INVENTION

It is one aspect of embodiments of the present invention to improve the detection characteristics of the current photodetector having a conversion layer, so that a higher yield is achieved and the presence of ghost images is suppressed.

These and other results are achieved according to embodiments of the invention in a lithographic apparatus having a radiation sensor which is moveable in a path traversed by the projection beam, for receiving primary radiation out of the projection beam, the sensor including a radiation-sensitive material which converts incident primary radiation into secondary radiation, a radiation detector capable of detecting said secondary radiation emerging from said radiation-sensitive material, and a filter material for substantially stopping secondary radiation from traveling in a direction away from the radiation detector.

Such a filter material tends to reduce the number of visible and infrared stray light photons reaching the photodiodes, creating an effectively solar blind detector. The top layer thus enhances the spectral selectivity of the image sensor.

The filter material may be transmissive for the primary radiation. In one embodiment, the filter material absorbs said secondary radiation. Preferably, however, the filter material is reflective for the secondary radiation. Such an application of an additional filter material layer with the proper optical characteristics on top of the conversion layer will selectively reflect the long wavelength secondary emissions from the conversion layer, while transmitting the primary DUV/VUV photons. When reflected, not only the forming of stray light and ghost images is prevented, but also the secondary radiation emitted by the photo-conversion layer is reflected back into a direction to the radiation detector.

This will increase the detector signal with the reflected fraction of the secondary photons originally emitted away from the photosensitive surface, and thereby reduce the loss in yield. It will also reduce the contribution of the backward emitted and at some point reflected secondary radiation.

In one embodiment of a lithographic apparatus according to the invention, in a direction away from the radiation detector, said radiation-sensitive material is applied before said filter material. Thus, radiation traveling towards the radiation sensor is first filtered by the filter material, then converted in the radiation-sensitive layer and then detected by the radiation detector. In this way, only the primary radiation is detected and stray-light and secondary light reflected back to the radiation detector is blocked or reflected away from the radiation detector.

In a further embodiment, said filter material comprises a semi-transmissive metal layer. It has been found that metal atoms are from the group of Al or Cr are useful in the context of the present invention.

In a still further embodiment said primary radiation is of a wavelength of 120 to 250 nm. The thickness of said filter material may be smaller than the wavelength of the primary radiation. In one embodiment, said filter layer is of a thickness of 0.5–30 nm.

The invention further relates to a device manufacturing method including projecting a patterned beam of radiation onto a target portion of a layer of radiation-sensitive material on a substrate, receiving primary radiation of the projection beam, with a radiation sensor including a radiation-sensitive material which converts incident primary radiation into secondary radiation, detecting the secondary radiation emerging from said radiation-sensitive material; and filtering secondary radiation such that secondary radiation traveling in a direction away from the radiation detector is attenuated.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiment 1

Figure 1:
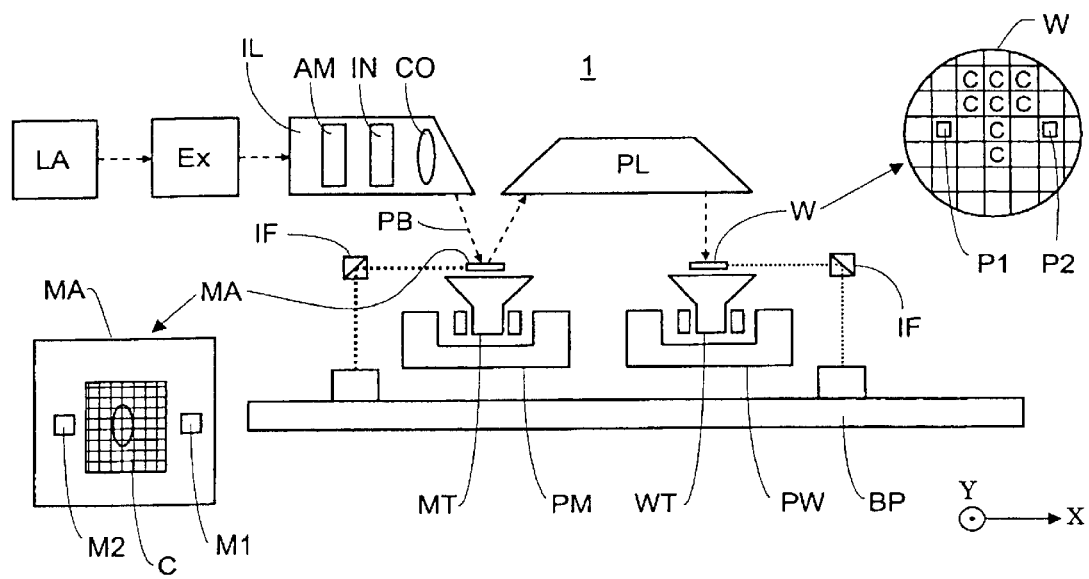
FIG. 1 depicts a lithographic projection apparatus according to an embodiment of the invention.

FIG. 1 schematically depicts a lithographic projection apparatus 1 according to a particular embodiment of the invention. The apparatus includes:

a radiation system Ex, IL, for supplying a projection beam PB of radiation (e.g. light in the deep ultraviolet region). In this particular case, the radiation system also comprises a radiation source LA;

a first object table (mask table) MT provided with a mask holder supported on a base plate BP for holding a mask MA (e.g. a reticle), and connected to first positioning means PM for accurately positioning the mask with respect to item PL;

a second object table (substrate table) WT provided with a substrate holder for holding a substrate W (e.g. a resist coated silicon wafer), and connected to second positioning means PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning means, such as a programmable mirror array of a type as referred to above.

The source LA (e.g. an excimer laser source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
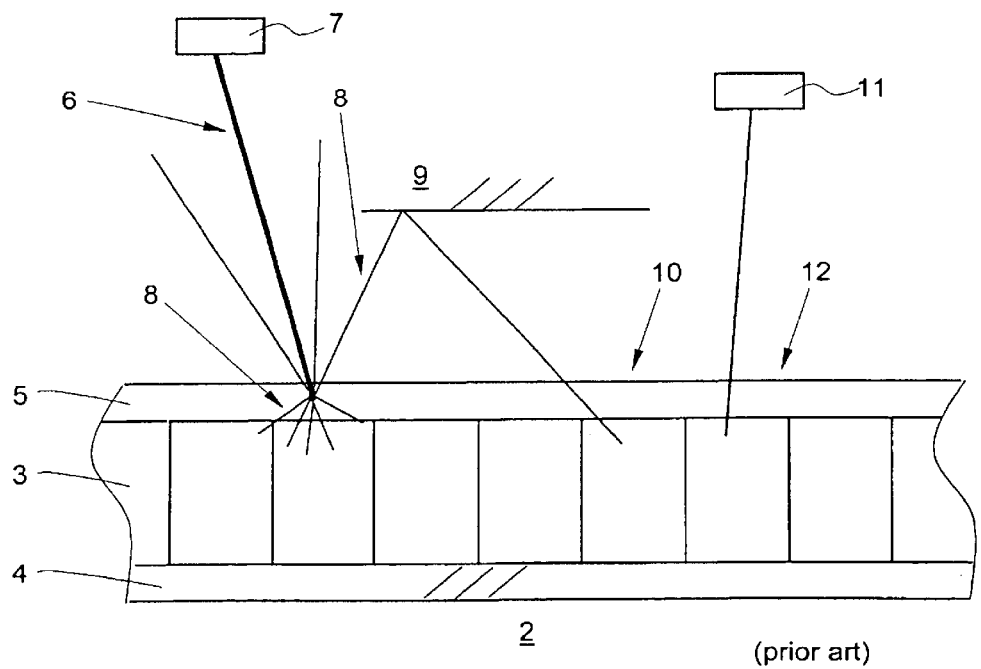
FIG. 2 schematically depicts a radiation sensor according to the prior art.

In order to be able to determine, for example, the intensity or dose at substrate level, a radiation sensor can be located at a convenient position, e.g. in the vicinity of the substrate. An embodiment of such a radiation sensor 2 is shown in FIG. 2. In the figure, the sensor comprises a pixel array of photo-sensitive elements 3. The photo-sensitive elements are generally of a conventional semi-conductor on a substrate 4 having photosensitive properties typically in the visible and (near) infrared region. In order to be able to detect radiation of a smaller wavelength, such as electromagnetic radiation in the DUV or VUV region or even Extreme Ultraviolet (typically 13.5 nm) up to the X-ray region (1 nm and less), a photo-conversion layer 5 is applied typically selected from the group of CaS:Ce, YAG:Ce and ZnS:Ag, Al, for example. Such a photo-conversion layer 5 is typically 1–50 micron thick and can therefore be applied without the loss of resolution of the underlying array of photodiodes (typical pixel size 5–50 micron).

In the conventional radiation sensor, about 50% of the incident radiation energy (thick line 6) from a radiation source 7 is traveling away from the photosensitive elements since the scintillation layer 5 emits secondary radiation (depicted by thin lines 8), generated as a result of a quantum-conversion process, more or less isotropically. As shown in the figure, such secondary radiation 8 may be reflected back by a reflective part 9 of the apparatus, thus forming ghost images when a radiation beam is reproduced on neighboring pixels 10. Such a reflective part 9 may be a part of the sensor assembly, such as a grating, but it may also be a general reflective side-wall or such like of another part of the apparatus. Especially when the detector is used for e.g. alignment or dose measurements the sensor usually comprises an optical element with a spatially varying transmission or phase distribution, in front of the photo-detector array. Such an additional optical element 9 will easily give rise to such spurious reflections.

Since the scintillation layer 5 is generally transmissive for electromagnetic radiation in the wavelength range of secondary radiation 8, light emitted by light sources 11 in that wavelength, such as, for example, monitoring lights or other forms of ambient light sources, generate a background level which is generally undesirable. Background light sources may include monitoring lights or other forms of ambient light source. These are shown schematically as light source 11, with the ambient light shown schematically as being incident in region 12.

Figure 3:
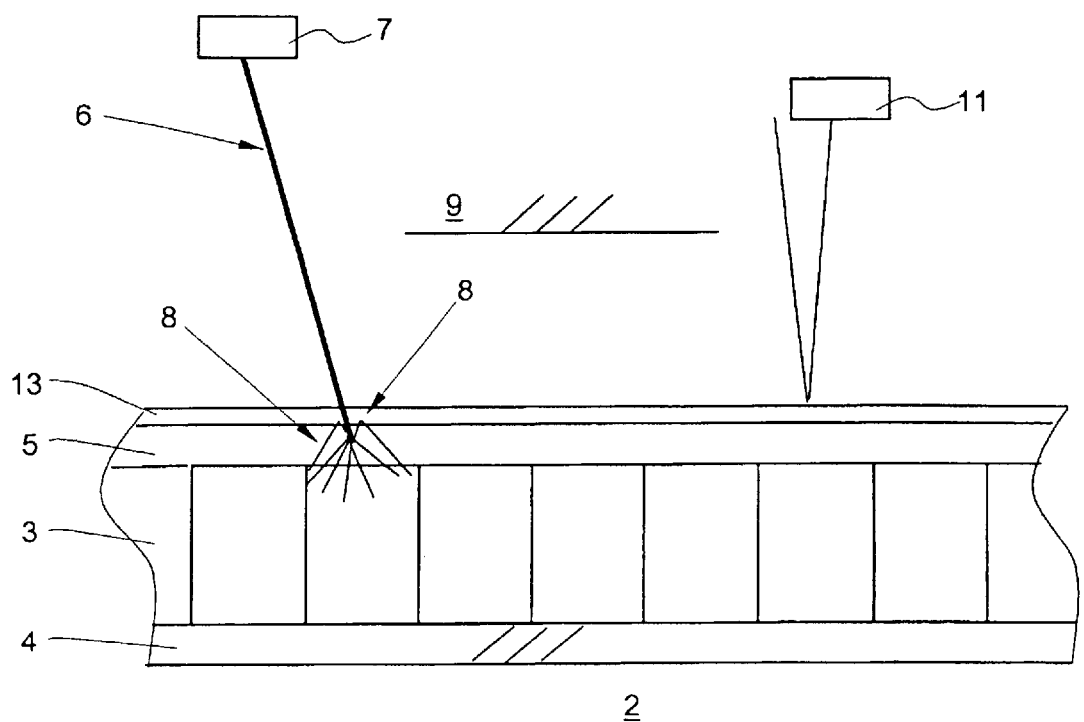
FIG. 3 schematically depicts a radiation sensor according to an embodiment of the present invention.

FIG. 3 schematically illustrates the presence of a layer of filter material 13 deposited on the photo-conversion layer 5. The filter material 13 prevents secondary radiation 8 from traveling in a direction away from the photo-sensitive layer 3. Hence, the energy of incident primary radiation 6 is "trapped" by the filter material 13 in the photo-scintillation layer 5. In the embodiment illustrated in FIG. 3, the filter material 13 is of a reflective nature for the secondary radiation 8, which offers the benefit of not only avoiding secondary light 8 traveling back into the apparatus, but also of increasing the light yield, since the light is reflected back into the photo-conversion layer 5 and is directed to the photo-sensitive layer 3. Preferably, the filter material is a thin metal layer ranging in the order of 0.5–30 nm.

Such a thin layer 13 provides optical characteristics that strongly depend on the wavelength of the incident light, i.e. the layer has a high transmission for the primary radiation and a low transmission for the secondary radiation. In general the secondary radiation will be partially reflected and partially absorbed.

The dichroic behaviour of the thin layer results from a specific interplay between the intrinsic optical material properties and the specific thickness of the applied layer. The general optical properties of such metal-multilayer structures have been described in the following reference: Max Born & Emile Wolf, Principles of Optics 6th edition, Pergamon Press. Oxford, 1993, ISBN 0-08-026482-4). Based on the theory, sub-wavelength ('thin', <100 nm) metal layers sandwiched between two other dielectrics (a gaseous or liquid medium or a solid state passivation layer on the top side, and the conversion layer on the bottom side) show a transmission behavior that changes upon the wavelength of the incident light.

In embodiments of the present invention, sub-wavelength layers (0.5–30 nanometers) layers are used. Especially a properly selected thickness of the layer allows a controlled balancing between the level of transmission and the level of absorption plus reflection. The right choice of materials and layer thickness results in effects that will differ substantially from the behaviour of thick layers having a thickness of more than 100 nm. Such thick layers absorb or reflect all light and are not transmissive for the relevant wavelengths and therefore make these 'thick' layers less well suited for detector wavelength screening applications.

Apart from the proper layer thickness, the right choice of materials helps to achieve optimum optical performance. Depending on the atomic and molecular structure of the thin layer, the incident light will interact with the layer in a material-unique way. This interaction strongly depends on the wavelength of the incident radiation. By selecting the proper material the wavelength dependency of the transmission can be matched to the detector screening application described.

As schematically depicted in FIG. 3, the stray light of secondary sources 11 is now blocked from the photo-sensitive layer 3, therefore, the background radiation detected by sensor 2 is reduced significantly. Furthermore, the presence of reflective elements 9 does not affect the photo-sensitivity of the radiation sensor 2 and ghost images are no longer created.

Figure 4:
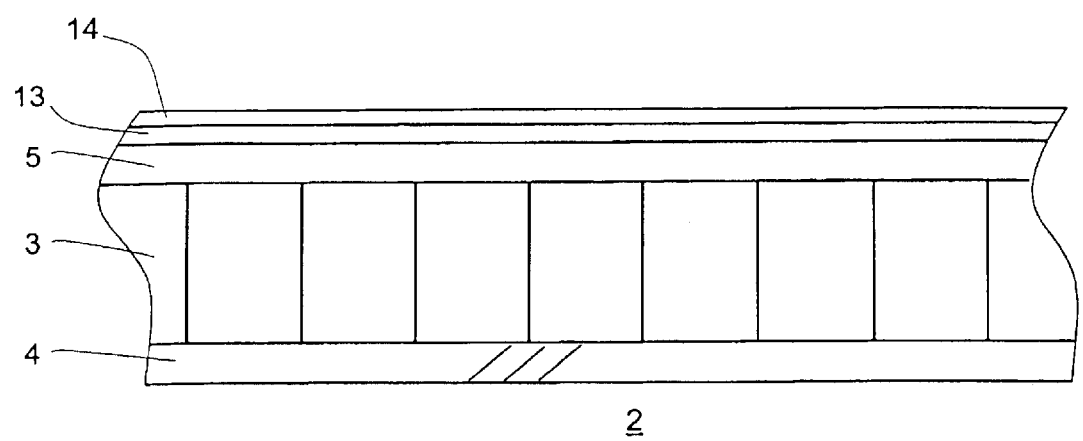
FIG. 4 schematically depicts an alternative embodiment of a radiation sensor according to an embodiment of the present invention.

In FIG. 4 a second embodiment is depicted of the radiation sensor of according to the invention. In this embodiment, the detector is protected by a passivation layer 14. Such a layer 14 is for protecting and stabilizing the top coating. This material can be selected from the group of oxide or fluoride materials (e.g. SiO2, MgF2, CaF2) that exhibits high transmission in the DUV wavelength range. The primary function of this material is the prevention of oxidation and chemical decomposition of the thin metal coating layer.

Figure 5A:
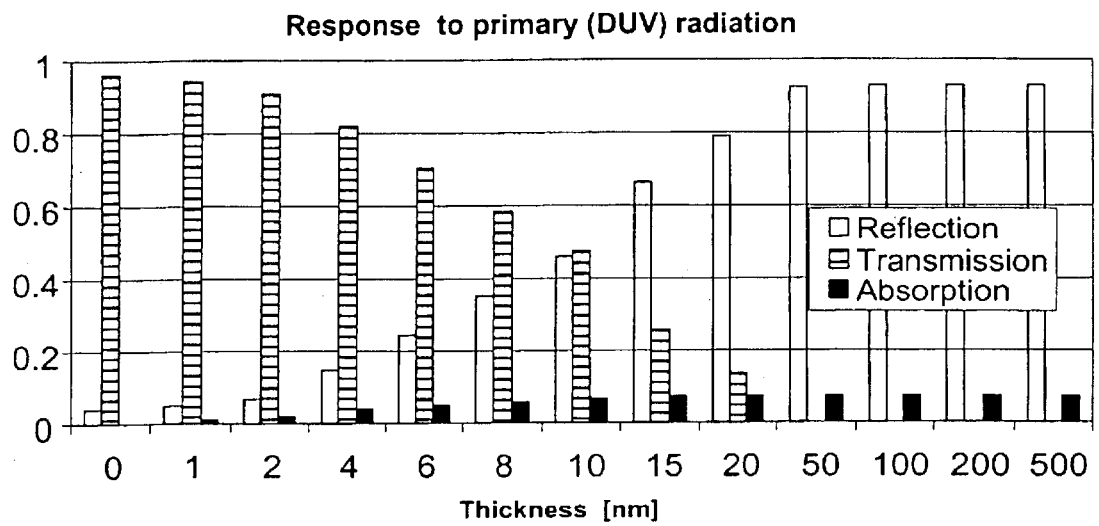
FIG. 5a shows a modeled optical response for aluminum irradiated by primary radiation in the DUV region, for different values of layer thickness, according to an embodiment of the present invention.
Figure 5B:
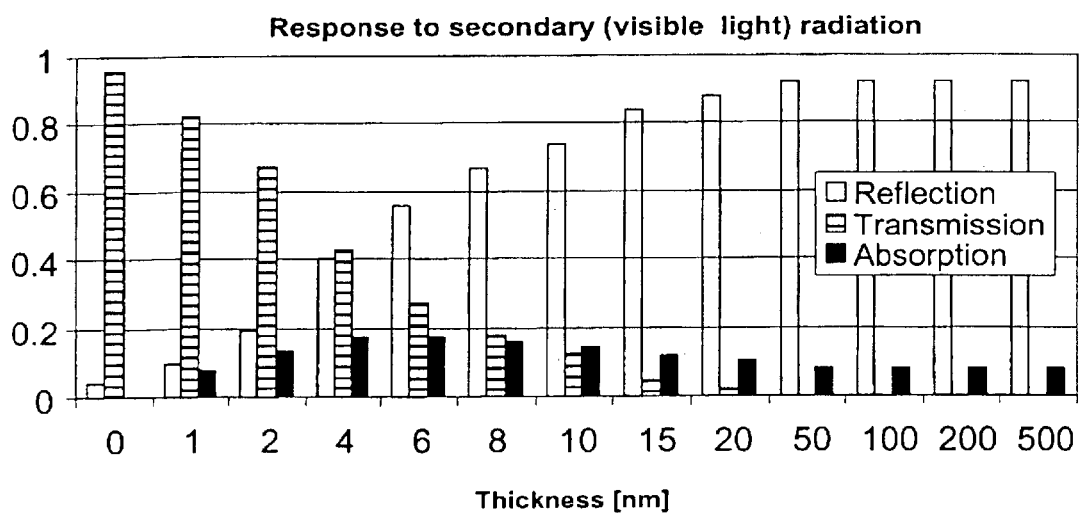
FIG. 5b shows a modeled optical response for aluminum irradiated by secondary radiation in the range of visible light, for different values of layer thickness, according an embodiment of the present invention.

In the FIGS. 5a and 5b a modeled optical response is given for Aluminium irradiated by (primary) radiation in the DUV region of 250–190 nm (FIG. 5a) and irradiated by (secondary) radiation in the range of visible light (FIG. 5b), for different values of the layer thickness. As can be seen from these figures, a preferred layer thickness varies from 0.5–30 nm, more precisely, 4–10 nm, or even more specific a layer thickness of 5–6 nm. In these preferred regions, the relative transmission of DUV light is high, whereas the transmission of secondary radiation is relatively low.

The reduction in the DUV transmission apparently occurs for a smaller thickness as the decrease in transmission of the secondary radiation. It is this thickness dependency that supports the wavelength dependent (dichroic) transmission behaviour.

Figure 6:
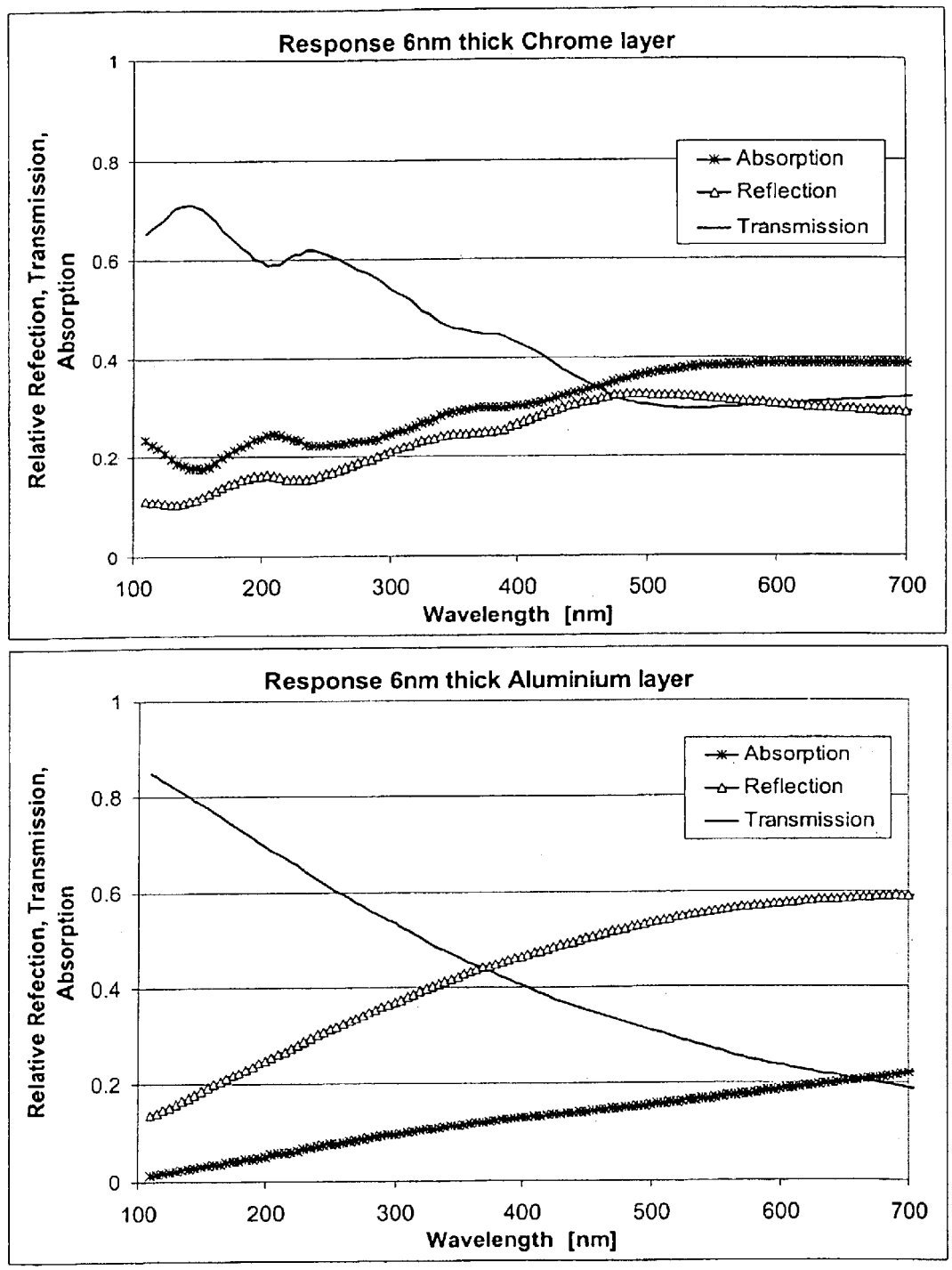
FIG. 6 shows measured optical responses, in range of wavelengths, for two metal layers (chromium and aluminum), according to an embodiment of the present invention.

In FIGS. 6a and 6b, a measured optical response is given for a range of wavelengths for two metal layers of interest. As can be derived from the figures, in FIG. 6a for Chromium, and in FIG. 6b for Aluminium, in the actinic wavelength area (150–248 nm) the transmission of radiation is relatively high, whereas the transmission in the visible light area (400 nm up to 1 micron) is relatively low. It follows, that these thin metal layers of Aluminium or Chromium show a dichroic behaviour in the relevant primary and secondary wavelengths which makes them suitable as a filter layer in the inventive radiation sensor.

While specific embodiments of the invention have been described above, it will be appreciated that the invention may be practiced otherwise than as described. The description is not intended to limit the invention.

What is claimed is:

1. A lithographic projection apparatus comprising:
   a radiation system configured to provide a projection beam of primary radiation;
   a support structure configured to support patterning structure, the patterning structure constructed and arranged to pattern the projection beam according to a desired pattern;
   a substrate table configured to hold a substrate;
   a projection system configured to project the patterned beam onto a target portion of the substrate; and
   a radiation sensor disposed in a path traversed by the projection beam, for receiving primary radiation of the projection beam, said radiation sensor comprising:
      a radiation-sensitive material that converts incident primary radiation into secondary radiation;
      a radiation detector adapted to detect said secondary radiation; and
      a filter material on an incident side of the radiation sensitive material and adapted to inhibit secondary radiation from traveling away from the radiation detector.

2. A lithographic projection apparatus according to claim 1, wherein the filter material is transmissive for the primary radiation.

3. A lithographic projection apparatus according to claim 1, wherein the filter material is reflective for the secondary radiation.

4. A lithographic projection apparatus according to claim 2, wherein the filter material is reflective for the secondary radiation.

5. A lithographic projection apparatus according to claim 1, wherein the filter material is in contact with the radiation sensitive material.

6. A lithographic projection apparatus according to claim 1, wherein said radiation-sensitive material is between the filter material and the radiation detector.

7. A lithographic projection apparatus according to claim 1, wherein said filter material comprises a semi-transmissive metal layer.

8. A lithographic projection apparatus according to claim 7, wherein said metal comprises at least one material selected from the group consisting of Aluminium or Chromium.

9. A lithographic projection apparatus according to claim 1, wherein said primary radiation is of a wavelength of about 150 to about 250 nm.

10. A lithographic projection apparatus according to claim 1, wherein a thickness of said filter material is less than a wavelength of the primary radiation.

11. A lithographic projection apparatus according to claim 1, wherein said filter layer is of a thickness of 0.5–30 nm.

12. A lithographic projection apparatus according to claim 1, wherein said radiation-sensitive material comprises a layer of a thickness of about 1 to about 50 micron.

13. A lithographic projection apparatus according to claim 1, wherein said radiation-sensitive material is selected from the group consisting of $Gd_2O_2S:Tb$, $Y_2SiO_5:Ce$, $Y_2SiO_5:Tb$, $Zn_2SiO_4:Mn$, $CaS:Ce$, $YAG:Ce$, $ZnS:Ag$ and $ZnS:Al$.

14. A lithographic projection apparatus according to claim 1, wherein said radiation detector comprises an array of photodiodes, the photodiodes having a pixel size of 5–50 micron.

15. A lithographic projection apparatus according to claim 1, wherein said filter layer is coated with a passivation layer, said passivation layer comprising at least one of $SiO_2$, $MgF_2$, and $CaF_2$.

16. A lithographic projection apparatus according to claim 1, wherein said radiation sensor comprises an optical element having a spatially varying transmission or phase distribution.

17. A device manufacturing method comprising:
   projecting a patterned beam of radiation onto a target portion of a layer of radiation-sensitive material on a substrate;
   using a radiation sensor which is moveable in a path traversed by the projection beam, for receiving primary radiation of the projection beam;
   converting incident primary radiation into secondary radiation;
   detecting said secondary radiation; and
   filtering said secondary radiation such that secondary radiation traveling in a direction away from the radiation detector is attenuated.

18. A device manufactured according to the method of claim 17.

19. A lithographic projection apparatus comprising:
   a radiation system configured to provide a projection beam of primary radiation;
   a support structure configured to support patterning structure, the patterning structure constructed and arranged to pattern the projection beam according to a desired pattern;
   a substrate table configured to hold a substrate;
   a projection system configured to project the patterned beam onto a target portion of the substrate, and
   a radiation sensor disposed in a path traversed by the projection beam, for receiving primary radiation of the projection beam, said radiation sensor comprising:
      a radiation-sensitive material that converts incident primary radiation into secondary radiation;
      a radiation detector adapted to detect said secondary radiation; and
      a filter material on an incident side of the radiation sensitive material and adapted to inhibit secondary radiation from being detected at a position spaced from a general region of initial incidence of the primary radiation.

20. A lithographic projection apparatus comprising:

a radiation system configured to provide a projection beam of primary radiation;

a support structure configured to support patterning structure, the patterning structure constructed and arranged to pattern the projection beam according to a desired pattern;

a substrate table configured to hold a substrate;

a projection system configured to project the patterned beam onto a target portion of the substrate, and a radiation sensor disposed in a path traversed by the projection beam, for receiving primary radiation of the projection beam, said radiation sensor comprising:

a radiation-sensitive material that converts incident primary radiation into secondary radiation;

a radiation detector adapted to detect said secondary radiation; and a filter material on an incident side of the radiation sensitive material that is transmissive for the primary radiation and reflective for the secondary radiation.

21. A lithographic projection apparatus according to claim 1, wherein a wavelength of said primary radiation is shorter than a wavelength of said secondary radiation.

22. A device manufacturing method according to claim 17, wherein a wavelength of said primary radiation is shorter than a wavelength of said secondary radiation.

23. A lithographic projection apparatus according to claim 19, wherein a wavelength of said primary radiation is shorter than a wavelength of said secondary radiation.

24. A lithographic projection apparatus according to claim 20, wherein a wavelength of said primary radiation is shorter than a wavelength of said secondary radiation.

* * * * *